United States Patent [19]

Waschler et al.

[11] Patent Number: 4,710,264

[45] Date of Patent: Dec. 1, 1987

[54] PROCESS FOR MANUFACTURING A SEMICONDUCTOR ARRANGEMENT

[75] Inventors: Eckehard Waschler, Neuhausen; Hermann Clauss, Leingarten; Heinz-Achim Hefner, Brackenheim, all of Fed. Rep. of Germany

[73] Assignee: Telefunken Electronic GmbH, Heilbronn, Fed. Rep. of Germany

[21] Appl. No.: 931,879

[22] Filed: Nov. 17, 1986

Related U.S. Application Data

[63] Continuation of Ser. No. 735,322, May 17, 1985, abandoned.

[30] Foreign Application Priority Data

Jun. 7, 1984 [DE] Fed. Rep. of Germany ....... 3421127

[51] Int. Cl.$^4$ .................... B44C 1/22; C03C 15/00
[52] U.S. Cl. .................................. 437/228; 156/646; 156/653; 156/643
[58] Field of Search ............... 156/643, 651, 653, 646; 29/571, 576 R, 576 W, 591

[56] References Cited

U.S. PATENT DOCUMENTS 4,377,438  3/1983  Moriya et al. .................. 156/653
4,566,940  1/1986  Itsumi et al. .................... 156/653 X
4,568,632  2/1986  Blum et al. ...................... 156/643
4,601,781  7/1986  Mercier et al. ................. 156/653 X

FOREIGN PATENT DOCUMENTS 2634095  2/1978  Fed. Rep. of Germany .
3116406  6/1982  Fed. Rep. of Germany .
3234907  9/1982  Fed. Rep. of Germany .
2119166  4/1982  United Kingdom .

OTHER PUBLICATIONS

Solid State Photo Resist Technology/Jun. 71, K. R. Dunham, pp. 41–46, "Solid State Technology."
Multilayer Resist Processes & Alternatives, Semiconductor International, Mar. 84, pp. 83–88, D. W. Johnson.
"Layer Resist Systems for Lithography," Solid State Technology/Aug. 81, pp. 74–80, Hatzakis.

Primary Examiner—Arthur Kellogg
Attorney, Agent, or Firm—Spencer & Frank

[57] ABSTRACT

In a process for manufacturing a semiconductor arrangement, wherein an uneven surface of the semiconductor arrangement is smoothened, there is produced on the uneven surface an insulating layer of such thickness that the insulating layer produced on the surface exhibits an even surface. The insulating layer is then partially removed again.

9 Claims, 11 Drawing Figures

PROCESS FOR MANUFACTURING A SEMICONDUCTOR ARRANGEMENT

This application is a continuation of application Ser. No. 735,322, filed May 17, 1985, now abandoned.

BACKGROUND OF THE INVENTION

The invention relates to a process for manufacturing a semiconductor arrangement, wherein an uneven surface of the semiconductor arrangement is smoothened.

Unevennesses on the surface of semiconductor arrangements are caused, for example, by trenches which are produced in the semiconductor body and serve to electrically insulate semiconductor components in the semiconductor body, or by conduction paths on the surface which are used for contacting the semiconductor components in the semiconductor body. The disadvantage of uneven surfaces is that it is not possible to produce fine conduction path structures on them or fine contacting holes in them. Fine conduction path structures cannot be produced on uneven surfaces on account of the danger of constrictions or interruptions in the conduction paths or bridges between the conduction paths occurring during the etching of fine conduction path structures on uneven surfaces. Fine contacting holes cannot be produced in insulating layers with an uneven surface because the holes would be too small or remain closed or be too large, depending on the height of the contacts.

SUMMARY OF THE INVENTION

The object of the invention is to provide a process for manufacturing a semiconductor arrangement wherein an uneven surface of the semiconductor arrangement is smoothened in a simple manner.

According to the invention, there is produced in a process for manufacturing a semiconductor arrangement, on the uneven surface, an insulating layer of such thickness that the insulating layer produced on the surface exhibits an even surface. The insulating layer is then partially removed again. The semiconductor arrangement may, for example, be a single component or an integrated circuit arrangement.

In accordance with a first embodiment of the invention, the insulating layer is removed to the thickness intended for the finished semiconductor arrangement. The removal of the insulating layer is essentially determined by two factors. The insulating layer remaining after removal must, on the one hand, be thick enough for the insulating layer to exhibit the necessary insulating strength. The insulating strength is, above all, of importance if conduction paths extending on the insulating layer must be insulated from conduction paths located thereunder by the insulating layer on which they extend. On the other hand, the insulating layer should not be too thick since an insulating layer which is not thin enough renders the etching of contact holes in the insulating layer difficult.

The insulating layer is removed to the desired thickness preferably throughout the entire surface. If necessary, the application and removal of the insulating layer may be repeated. This is, for example, necessary if the surface waviness is so pronounced that it is not possible to smoothen the surface with one coating.

If, after removal, the insulating layer is too rough, there is applied, in accordance with another embodiment of the invention, on the insulating layer after removal, a second insulating layer whose surface exhibits the necessary smoothness. The removal of the first insulating layer and the thickness of the second insulating layer are given such dimensions that the two insulating layers together exhibit the necessary thickness for the finished semiconductor arrangement.

BRIEF DESCRIPTION OF THE DRAWINGS

The invention will now be described in greater detail, by way of examples, with reference to the drawings, in which.

DESCRIPTION OF THE PREFERRED EMBODIMENTS

Figure 1:
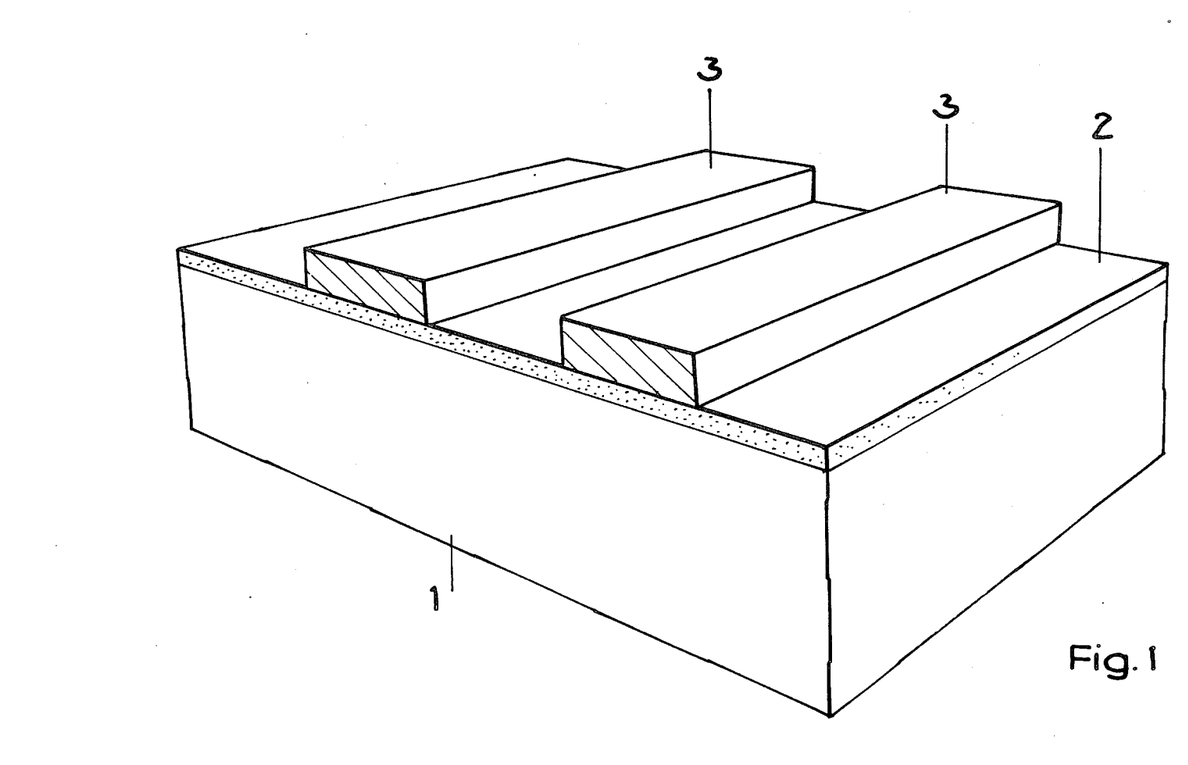
FIG. 1 shows a semiconductor arrangement with an uneven surface.

FIG. 1 shows a semiconductor body 1 with an insulating layer 2 as an example of a semiconductor arrangement with an uneven surface as a result of elevations formed on the surface by metallic conduction paths 3 serving, for example, to contact semiconductor zones in the semiconductor body and, consequently, to contact the semiconductor components. The semiconductor body 1 consists, for example, of silicon, and the insulating layer 2, for example, of silicon dioxide. The conduction path 3 consists, for example, of aluminum or of polysilicon.

The unevenness of the surface of the semiconductor arrangement of FIG. 1 causes by the conduction paths 3 is, for example, inconvenient when, as is necessary in the case of wiring in several planes, further conduction paths, not illustrated in FIG. 1, are to be conducted via the conduction paths 3. When further conduction paths are mounted above already existing conduction paths, it is, above all, the steps formed by the lower conduction paths 3 that are disturbing, in particular, the height of the steps and the edge profile of the conduction paths. It is especially in the production of fine conduction path structures above the already existing conduction paths 3 that the conduction path steps are inconvenient since there is the danger particularly during etching of fine conduction path structures that conduction path constrictions, conduction path interruptions or bridges between the conduction paths may occur. Conduction path steps also hinder the etching of contact holes as very thin photoresists and, consequently, an even insulating layer surface are prerequisites of precise etching of contact holes—above all, in the case of small contact holes.

Figure 2:
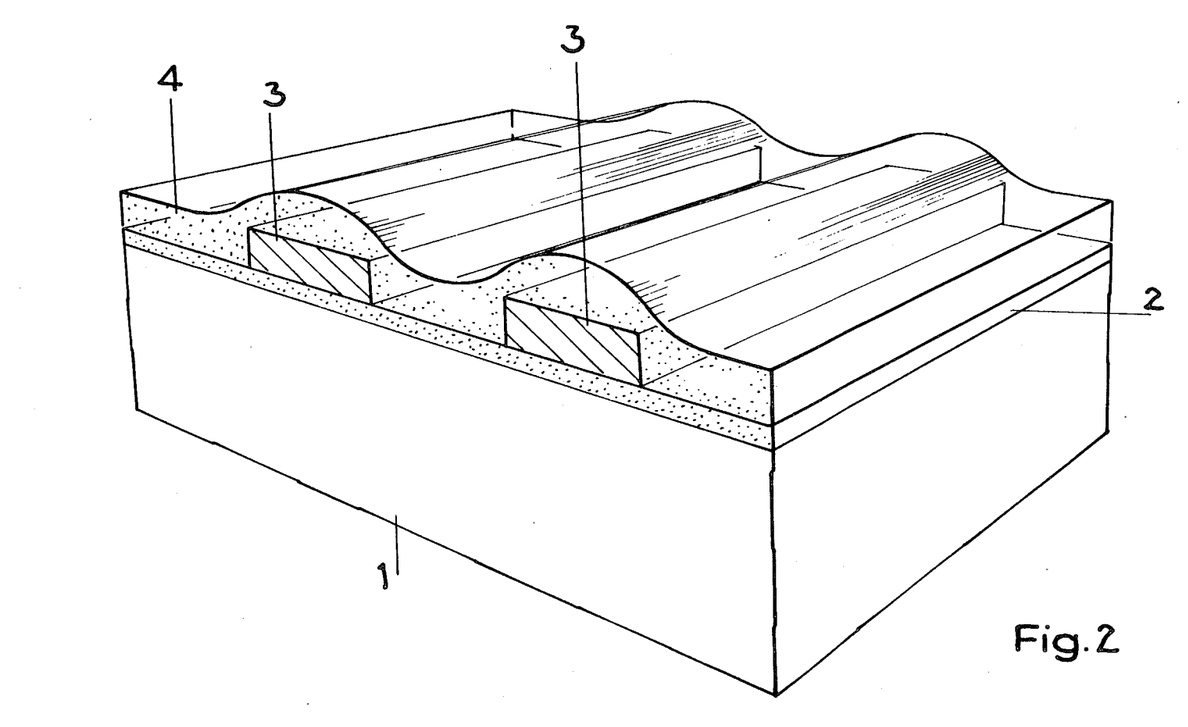
FIG. 2 shows a semiconductor arrangement with a second insulating layer.

In order to mount further conduction paths which cross the conduction paths 3 of FIG. 1 or which are arranged above the conduction paths 3 of FIG. 1 in a higher conduction path plane (wiring in several planes), there is disposed on the conduction paths 3 of FIG. 1 and also on the first insulating layer 2 located therebetween, a second insulating layer 4 which is, however, as FIG. 2 shows, of relatively wavy configuration in known semiconductor arrangements. As explained above, the disadvantage of a wavy insulating layer surface is that it results in conduction path constrictions, conduction path interruptions or bridges between the conduction paths when conduction paths are mounted. A further disadvantage of a wavy surface is that precisely defined contact holes are very difficult to etch in insulating layers with a wavy surface. Both disadvantages occur, above all, with very fine structures.

Figure 3:
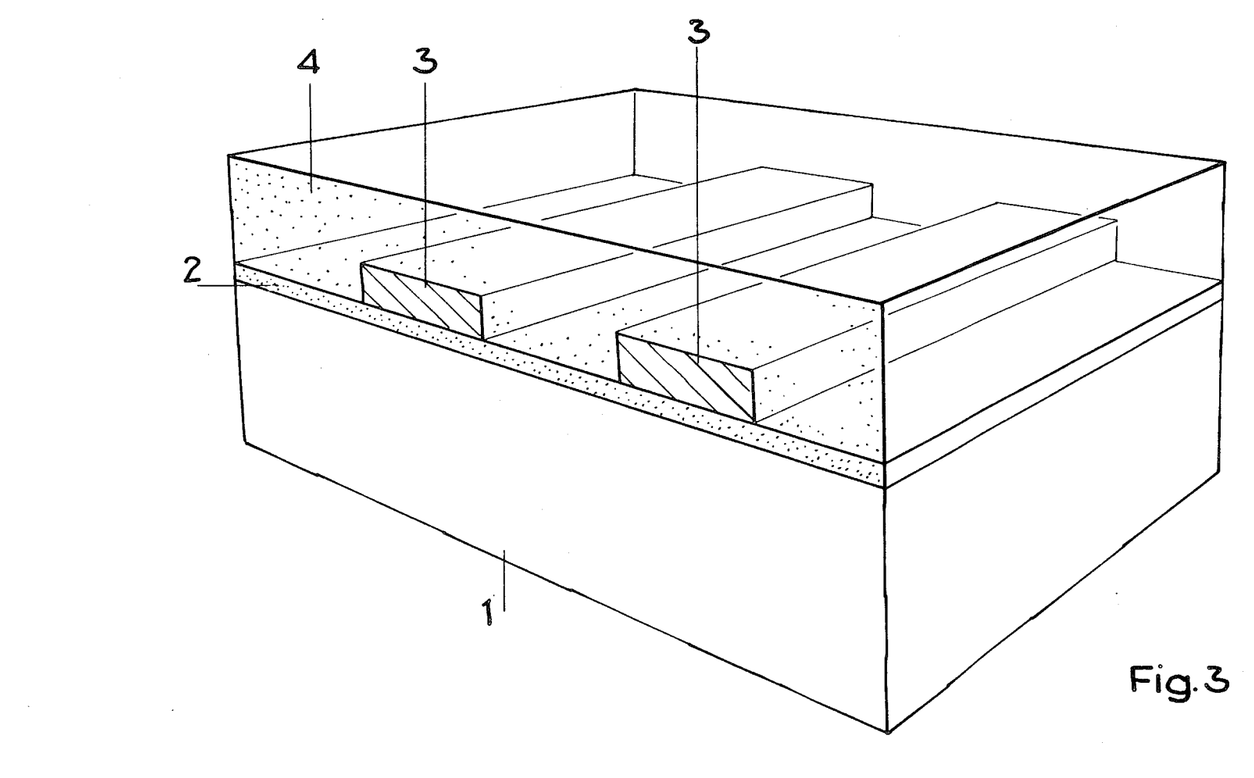
FIG. 3 shows a semiconductor arrangement with a thick second insulating layer.

In order to prevent the second insulating layer 4 from exhibiting a disadvantageous surface waviness, the second insulating layer 4 is given, in accordance with the invention, less thin dimensions than is usually the case (FIG. 2), and, in accordance with FIG. 3, is made thick enough for its surface not to exhibit any waviness and to, therefore, be as even as possible. The surface of the second insulating layer 4 becomes more and more even as the dimensions of its thickness increase.

Figure 4:
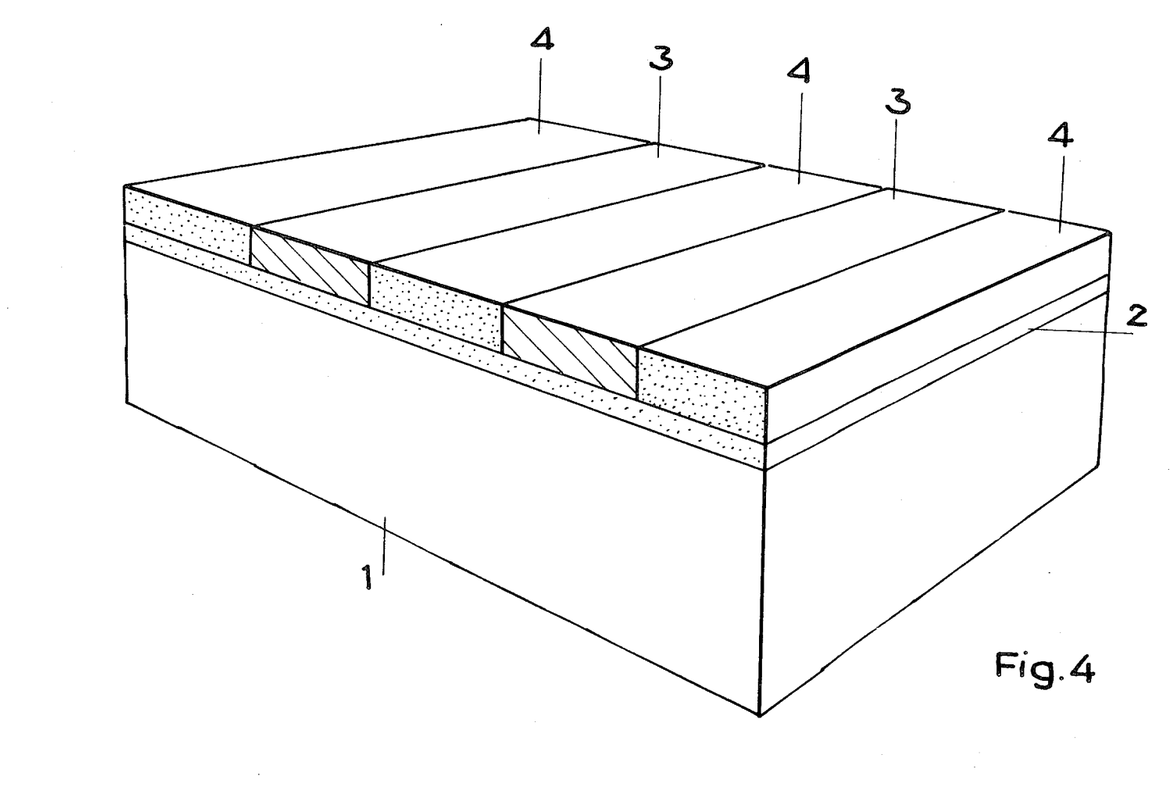
FIG. 4 shows the semiconductor arrangement after removal of the second insulating layer.

Following production of the second insulating layer 4, which, in accordance with the invention, is made as even as possible by appropriate thickness dimensions this insulating layer is removed to the desired thickness throughout the entire surface, as shown in FIG. 4. The second insulating layer 4 is removed, for example, by dry etching or by wet-chemical etching. In the embodiment of FIG. 4, the second insulating layer is removed until the thickness intended for the finished semiconductor arrangement is reached. This final thickness is essentially determined by the insulating strength, i.e., the insulating layer must be thick enough to exhibit a certain insulating strength. On the other hand, the insulating layer should not be too thick, but rather thin enough to enable precisely defined contact holes of a fine structure to be made therein. The insulating layer 4 is removed, for example, by dry etching or by wet-chemical etching.

Figure 5:
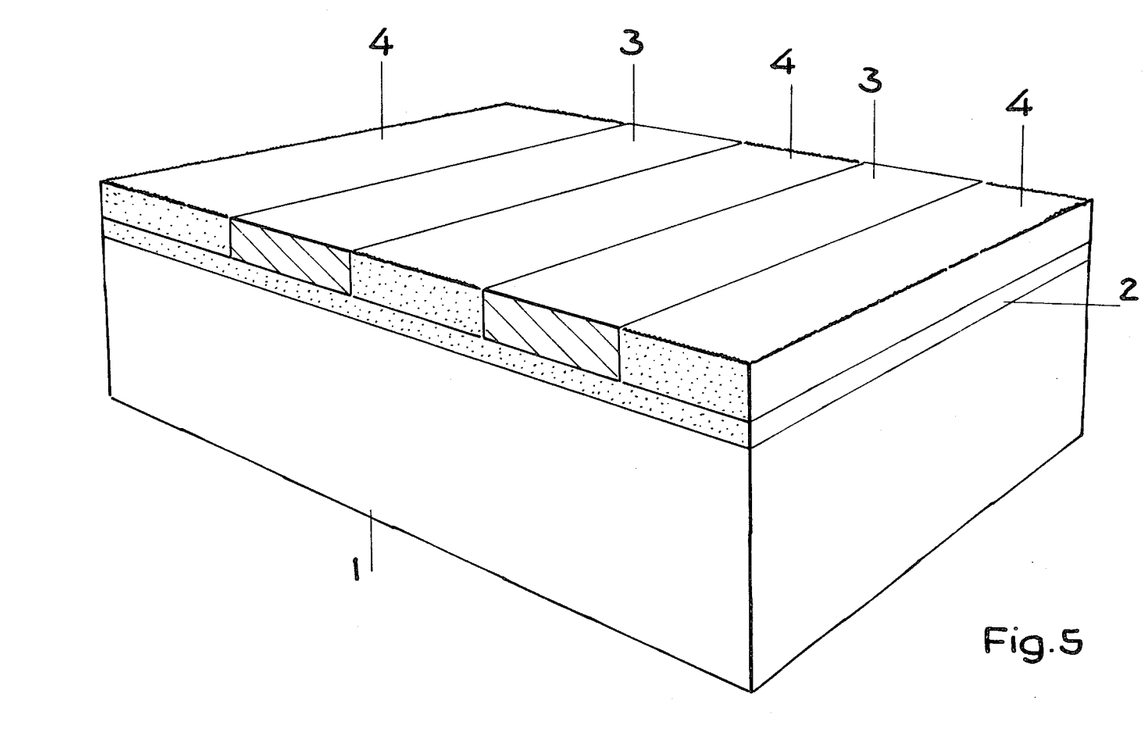
FIG. 5 shows a semiconductor arrangement with a rough surface.
Figure 6:
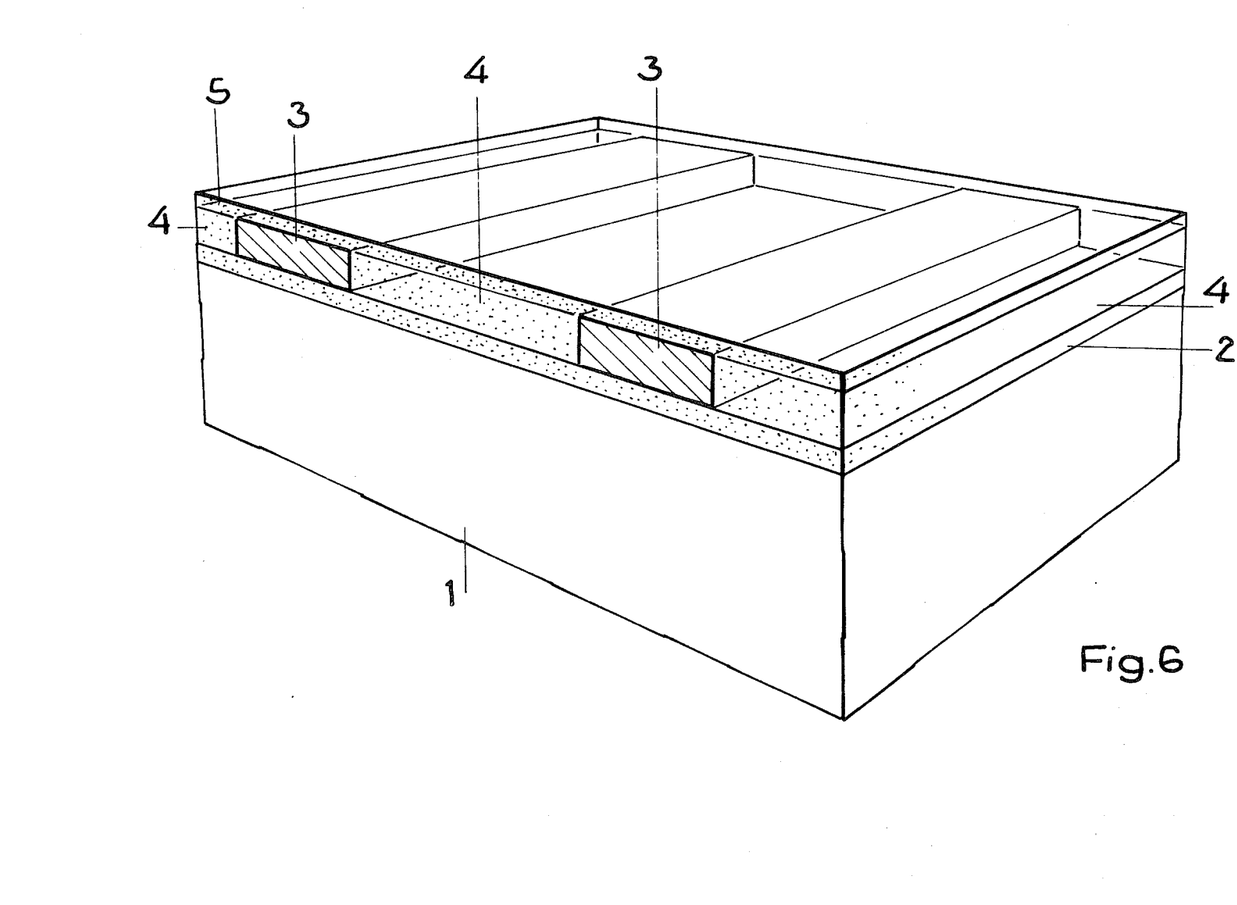
FIG. 6 shows a semiconductor arrangement with a third insulating layer instead of the second insulating layer which has been removed.

If, in accordance with FIG. 5, after partial removal, the second insulating layer 4 exhibits a relatively rough surface, a third insulating layer 5 is produced, in accordance with FIG. 6, in a further development of the invention, on the second insulating layer 4 after removal. The third insulating layer 5 is of such thick dimensions that its surface no longer exhibits any roughness. In the event that a third insulating layer is provided for elimination of a rough surface, during the removal, the second insulating layer 4 is preferably further removed than would be the case without the third insulating layer 5, more particularly, in the event of use of a third insulating layer 5, the second insulating layer 4 is preferably further removed by the amount of the thickness of the third insulating layer.

If during removal of the second insulating layer 4, this insulating layer is impaired with respect to its insulating properties, the third insulating layer 5 is given correspondingly thicker dimensions, more particularly, such thick dimensions that the total insulating layer 4, 5 resulting from the second insulating layer 4 and the third insulating layer 5 exhibits the necessary insulating strength. In the event of use of superimposed conduction paths, an insulating layer fulfills the necessary insulating strength requirements if the superimposed conduction paths are adequately insulated from one another. The total insulating layer 4, 5 must, however, meet another requirement in addition to the aforementioned insulating strength, more particularly, it should be thin enough for the formation of contact holes in it not to be impaired. For, as described above, the thinner an insulating layer is, the easier it is to produce precisely structured holes or openings therein.

The thickness of the second and third insulating layers is essentially determined by the thickness of the conduction paths 3. If the conduction paths 3 are, for example, $1.5\mu$ thick, the second insulating layer 4 is made, for example, from 2.5 to $3\mu$ thick, and is subsequently removed to a thickness of $2\mu$. If, however, a third insulating layer 5 is necessary because the surface of the second insulating layer 4 is too rough, the second insulating layer 4 is removed, for example, to a thickness of $1.5\mu$. In this case, the third insulating layer 5 is made, for example, $0.5\mu$ thick.

Before removal, the second insulating layer 4 is, in any case, thicker than the total insulating layer 4, 5. The second and third insulating layers consist, for example, of an organic compound such as, for example, polyimide, while the first insulating layer consists, for example, of silicon oxide. The semiconductor body 1 which may be a single component or an integrated circuit, preferably consists of silicon.

Figure 7:
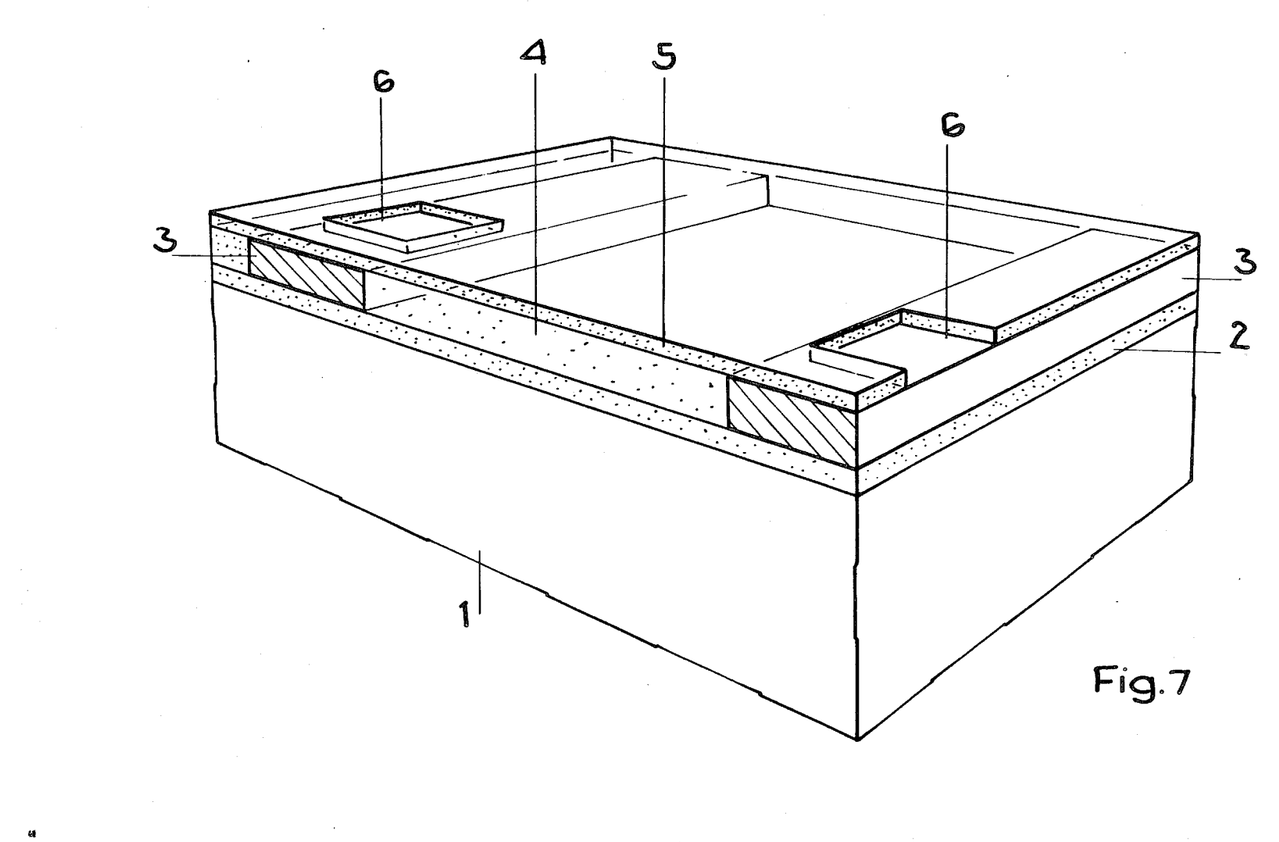
FIG. 7 shows a semiconductor arrangement with contacting holes.
Figure 8:
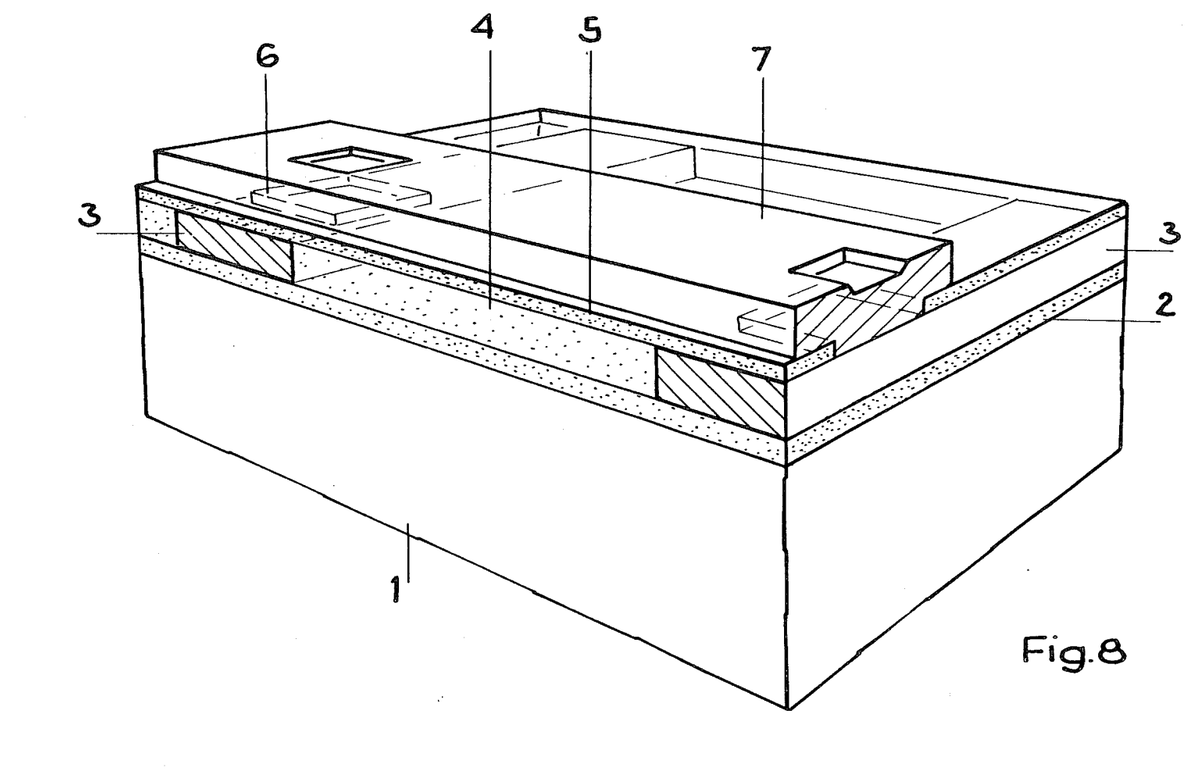
FIG. 8 shows a conduction path in a second plane.

FIG. 7 shows contacting holes 6 which are etched into the insulating layer 5. FIG. 8 illustrates an additional conduction path 7 which is arranged above the conduction paths 3 in a second plane.

A further important application results for the multilayer photoresist technique. In this case, too, an uneven semiconductor surface must be smoothened so that extremely fine lines and holes are resolvable during the subsequent photolithography process. The "standing wave" effect which is disadvantageous in the production of extremely fine structures is, furthermore, to be avoided by application of a photoresist which is as thin as possible and by a surface which is as even as possible. Only thus may the structures in the micron and submicron range required for the VLSI technique be produced.

In accordance with the first embodiment, the uneven surface is preferably smoothened by a thick organic layer and removed to the thickness necessary for the photolithography, with surface roughnesses in the organic layer being avoided. Further thin organic or inorganic layers or layer sequences serving as etching masks may then be applied to the thus smoothened surface. This multilayer photoresist technique is described, for example, in Solid State Technology, August 1981, by M. Hatzakis, and in Semiconductor International, March 1984, by D. W. Johnson. The thick organic layer may, for example, be polyimide or photoresist. The etching is preferably carried out with the aid of the known reactive ion etching.

Figure 9:
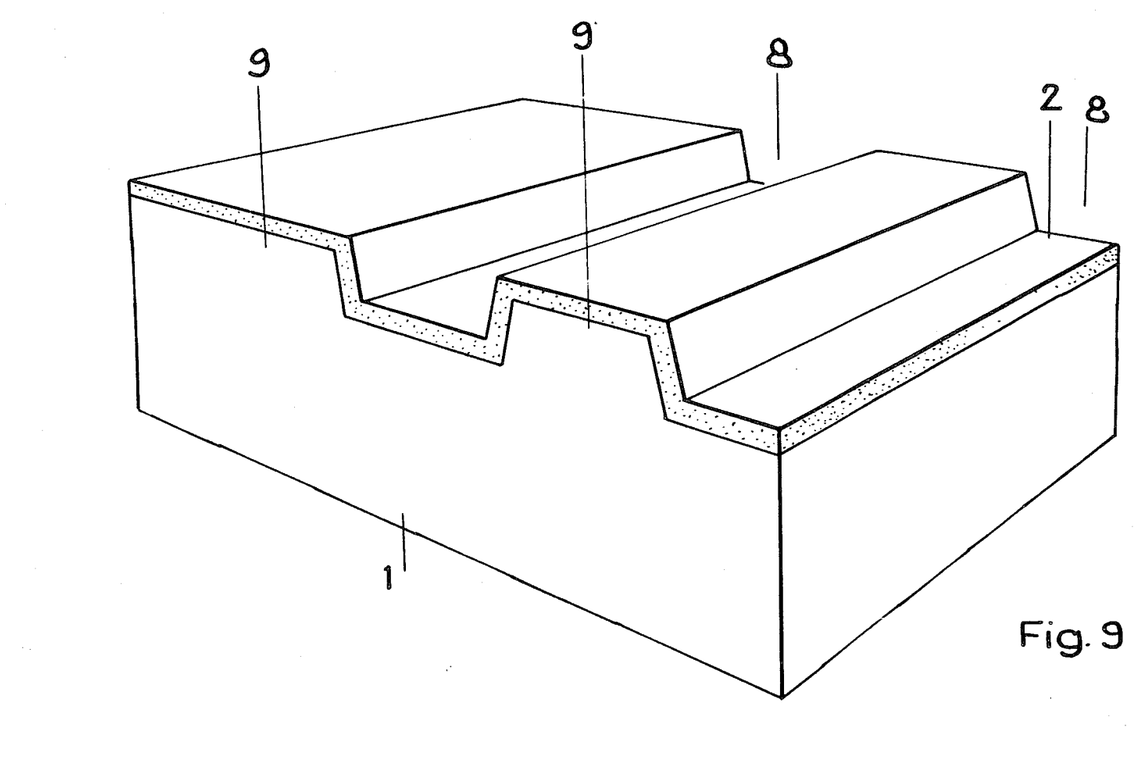
FIG. 9 shows a semiconductor arrangement with trenches.

FIG. 9 shows a further example of a semiconductor arrangement with an uneven surface. However, in the embodiment of FIGS. 9 to 11, the unevenness of the surface is not due to conduction paths, but to trenches 8 provided in the semiconductor body 1 for electrical separation of semiconductor components. The components are located in the elevations 9 between the trenches 8. The semiconductor body 1, consisting, for example, of silicon, may be covered with an oxide layer 2.

Figure 10:
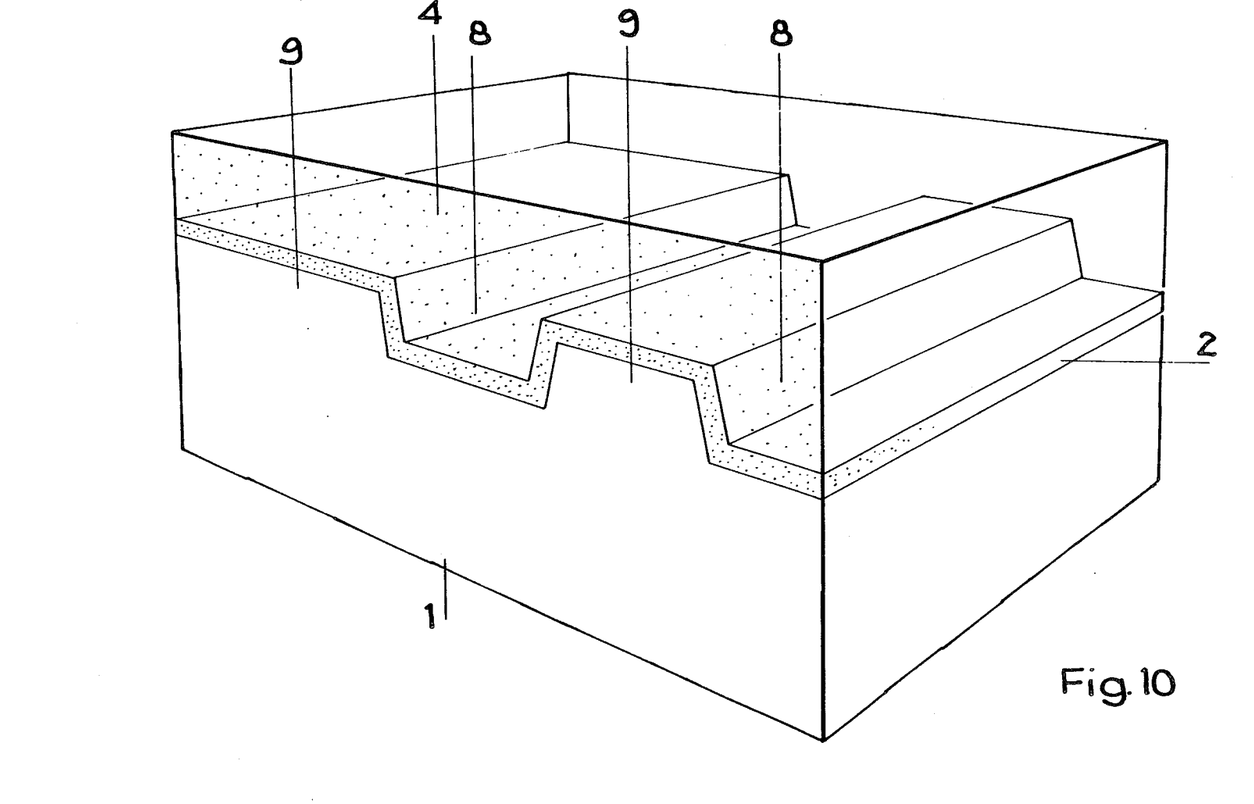
FIG. 10 shows the filling-up of the trenches by a second insulating layer.
Figure 11:
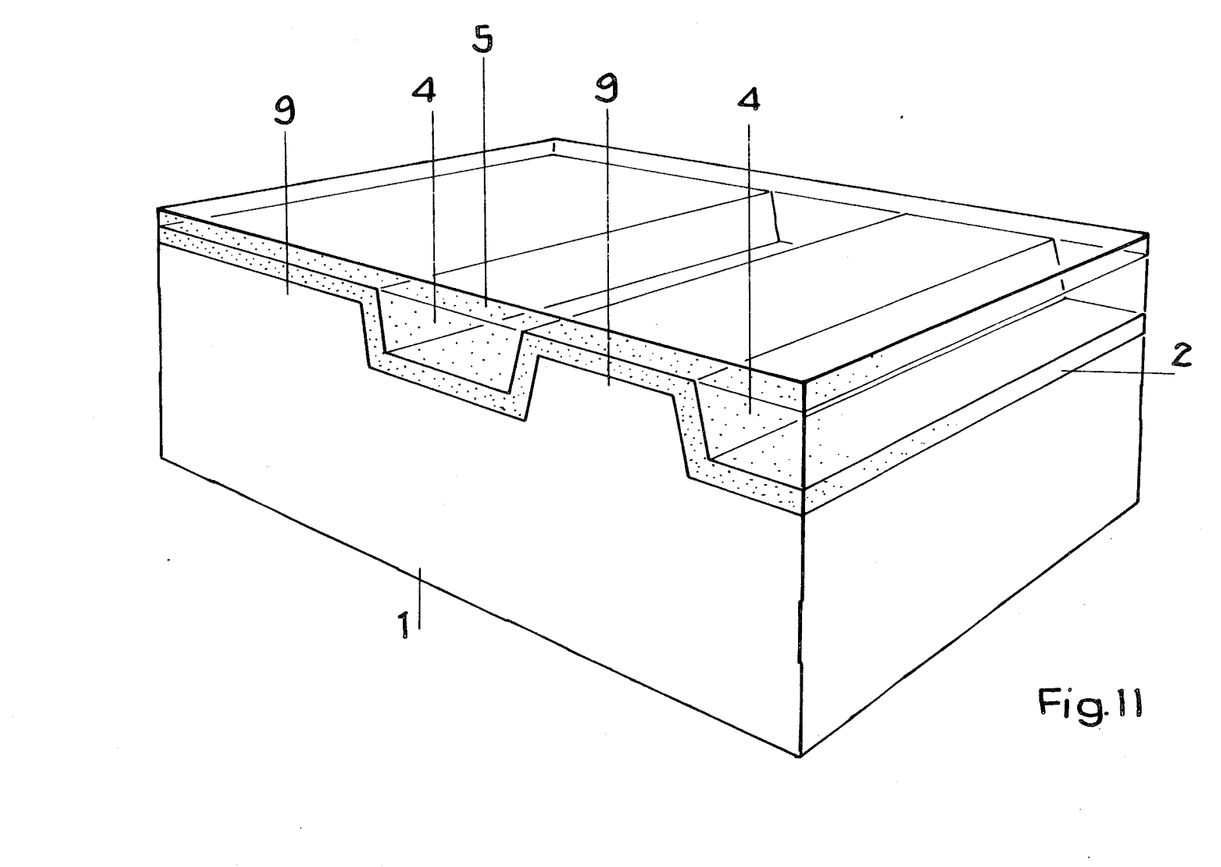
FIG. 11 shows the removal of part of the second insulating layer and deposition of a third insulating layer.

In order to smoothen the surface of the arrangement in FIG. 10, there is applied to the surface, in accordance with FIG. 11, a second insulating layer 4 which may again, for example, consist of polyimide. In accordance with the invention, the second insulating layer 4 filling out the trenches 8 is again given dimensions of such thickness that its surface is even and exhibits no waviness. After production of the insulating layer 4, part of this insulating layer is removed, in accordance with FIG. 11, but only to the extent that the remaining part of the insulating layer 4, in accordance with the preceding statements, exhibits the necessary insulating strength.

If, after removal, the surface of the insulating layer 4 is too rough, there is applied, in accordance with the first embodiment, a third insulating layer 5. The statements made in connection with the first embodiment apply accordingly to the third insulating layer.

FIGS. 1 to 11 do, of course, show only a small section of an integrated circuit arrangement which, in reality, comprises a plurality of conduction paths, contacting holes and semiconductor components. If there are more than two conduction path planes, the invention is applied accordingly to the insulating layers between the various conduction path planes.

What is claimed is:

1. A process for obtaining a planar-surface semiconductor consisting essentially of
   forming an insulating layer on an uneven semiconductor surface, the insulating layer being planar and having a depth substantially greater than the thickest portion of the uneven surface to build an extra depth; and
   removing a portion of the insulating layer over the entire surface to obtain a thinner insulating layer having a substantially planar surface of a standard thickness.

2. The process of claim 1, wherein
the steps of forming an insulating layer and removing a portion thereof are conducted more than one time.

3. The process of claim 1, wherein
if the surface of the insulating layer is rough after removing a portion thereof, a second insulating layer is formed onto the first insulating layer.

4. A process according to claim 3, wherein
the total thickness of the first and second insulating layers is such that the first and second insulating layers together exhibit a standard insulating layer thickness.

5. The process of claim 1, further comprising
depositing an inorganic insulating layer directly onto the semiconductor body, and
forming the insulating layer on said inorganic insulating layer.

6. The process of claim 5, wherein
the inorganic insulating layer is a silicon oxide layer or a silicon nitride layer.

7. The process of claim 1, wherein the insulating layer comprises an organic compound.

8. The process of claim 7, wherein the organic compound is a polyimide.

9. The process of claim 1, wherein the insulating layer is formed by centrifugation.

* * * * *